United States Patent
Weng et al.

(10) Patent No.: US 9,007,030 B2
(45) Date of Patent: Apr. 14, 2015

(54) METHOD OF ESTIMATING BATTERY REMAINING POWER IN ELECTRIC VEHICLE

(75) Inventors: Kuo-Liang Weng, Miaoli (TW);
Yi-Chau Chiou, New Taipei (TW);
Jia-Sing Hsu, Kaohsiung (TW)

(73) Assignee: Automotive Research & Testing Center, Changhua (TW)

( * ) Notice: Subject to any disclaimer, the term of this patent is extended or adjusted under 35 U.S.C. 154(b) by 670 days.

(21) Appl. No.: 13/336,718

(22) Filed: Dec. 23, 2011

(65) Prior Publication Data
US 2013/0166117 A1   Jun. 27, 2013

(51) Int. Cl.
*H02J 7/00* (2006.01)
*B60L 11/18* (2006.01)
*G01R 31/36* (2006.01)
*H01M 10/42* (2006.01)

(52) U.S. Cl.
CPC .......... *G01R 31/361* (2013.01); *B60L 11/1861* (2013.01); *B60L 11/1864* (2013.01); *B60L 2240/547* (2013.01); *B60L 2240/549* (2013.01); *B60L 2240/662* (2013.01); *B60L 2260/42* (2013.01); *B60L 2260/44* (2013.01); *G01R 31/3648* (2013.01); *H01M 10/42* (2013.01); *H01M 2220/20* (2013.01); *Y02T 10/7005* (2013.01); *Y02T 10/7044* (2013.01); *Y02T 10/7061* (2013.01); *Y02T 10/7291* (2013.01); *Y02T 90/16* (2013.01)

(58) Field of Classification Search
CPC .............. H02J 7/0031; H02J 2007/004; H02J 2007/0037; Y02E 60/12; H01M 10/48
USPC .......................................................... 324/426
See application file for complete search history.

(56) References Cited

U.S. PATENT DOCUMENTS

| | | | | |
|---|---|---|---|---|
| 4,499,424 A | * | 2/1985 | Rowlette | 324/427 |
| 4,677,363 A | * | 6/1987 | Kopmann | 320/131 |
| 5,808,445 A | * | 9/1998 | Aylor et al. | 320/132 |
| 6,388,447 B1 | * | 5/2002 | Hall et al. | 324/426 |
| 2005/0083017 A1 | * | 4/2005 | Suzuki | 320/128 |
| 2011/0077880 A1 | * | 3/2011 | Gering | 702/63 |
| 2012/0197341 A1 | * | 8/2012 | Cowley et al. | 607/45 |
| 2013/0158868 A1 | * | 6/2013 | Chen et al. | 701/527 |
| 2014/0210267 A1 | * | 7/2014 | Ishida et al. | 307/31 |

* cited by examiner

*Primary Examiner* — Arun Williams
(74) *Attorney, Agent, or Firm* — Che-Yang Chen; Law Office of Michael Chen

(57) ABSTRACT

A method of estimating remaining battery power in electric vehicles is provided. The method uses coulometric detection method to obtain remaining battery power and uses an open voltage method to modify the coulometric detection method when modified conditions are met as well as different battery characteristics and conditions when in use. The remaining battery power in electric vehicles can conduct a dispersion degree detection at every stage and when a detection value is larger than a preset value, a self-adjusting mechanism will be activated to modify the battery power. When the battery is charged for a longer period of time, a regression method is used to establish a modified equation to increase precision of estimating remaining battery power.

5 Claims, 5 Drawing Sheets

METHOD OF ESTIMATING BATTERY REMAINING POWER IN ELECTRIC VEHICLE

FIELD OF THE INVENTION

The present invention relates to method of estimating battery power, and more particularly to using an open voltage method to modify coulometric detection method to estimate remaining battery power in electric vehicles.

BACKGROUND OF THE INVENTION

Coulometric detection method is often used to measure remaining battery power when electric vehicles are moving. The coulometric detection method is called Ampere-hour method or integration method, which can be used when the vehicles are moving, as can be seen in FIG. 5. When the battery is charged, the battery power is accumulated from an initial point based on the ampere-hour method to obtain the battery power at any time during charging. Likewise, when the battery is discharged, the battery power decreases from based on the ampere-hour method, and the battery power can be represented by $I=\int_0^T i(t)dt$. According to the concept of energy conservation, the coulometric detection method has a certain degree of precision, and an accumulated number using the Ampere-hour method during charging should be equal to a decreasing number using the Ampere-hour method during discharging. However, accumulating errors may occur in the coulometric detection method after every charge/discharge process due to the error in the manufacturing process of electronic components, measurement analysis, sampling, etc. The accumulating error increases with the usage of the battery over time, so the remaining battery power shown in the vehicle does not reflect real reaming battery power and a user has no way to know the real remaining battery power, which may causes inconvenience to the user. This is the problem the present invention would like to solve.

SUMMARY OF THE INVENTION

The problem to be solved in the present invention is to provide a method of estimating remaining battery power in electric vehicles.

Coulometric detection method is used to obtain remaining battery power in electric vehicles. When the battery rests for a certain period of time to reach a steady status, the difference between the remaining battery power and the modified battery power meets the modified condition to use the modified battery power to modify battery remaining power. Namely, using an open voltage estimation method to modify the coulometric detection method with accumulating errors to improve the precision of the coulometric detection method dynamically. Also, the estimation of remaining battery power can detect the degree of dispersion at every stage, and when the detection value is larger than the preset value, the self-adjusting mechanism is activated to modify the battery power. When the battery has been charged for a longer period of time, a modified equation regarding the battery characteristic curve is established using a regression method. The abovementioned method is used to modify the coulometric detection method with accumulating errors to increase the precision when estimating remaining battery power.

The main objective of the present invention is that the open voltage estimation method is a modified open voltage method. The modified open voltage estimation method first estimates a voltage value of a plurality of battery; selects a relatively stable sample range among the batteries, and weighs and averages the samples selected in the sample range and multiplies the total number of batteries, and selects representing batteries using the modified open voltage method to further reflect the voltage value.

The second objective of the present invention is that the present invention uses coulometric detection method to obtain the remaining battery power in the electric vehicle, and an open voltage estimation method is used to obtain a modified battery power and satisfy modified conditions to use modified battery power to modify battery remaining power to increase the precision of dynamic measurement using coulometric detection method.

Another objective of the present invention is that when the batteries in the modified open voltage method are completely charged and discharged, the degree of dispersion can be detected at every stage and the self-adjusting mechanism can be activated to modify the battery power to increase the estimation precision of the open voltage method.

DETAILED DESCRIPTION OF THE INVENTION

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

Figure 1:
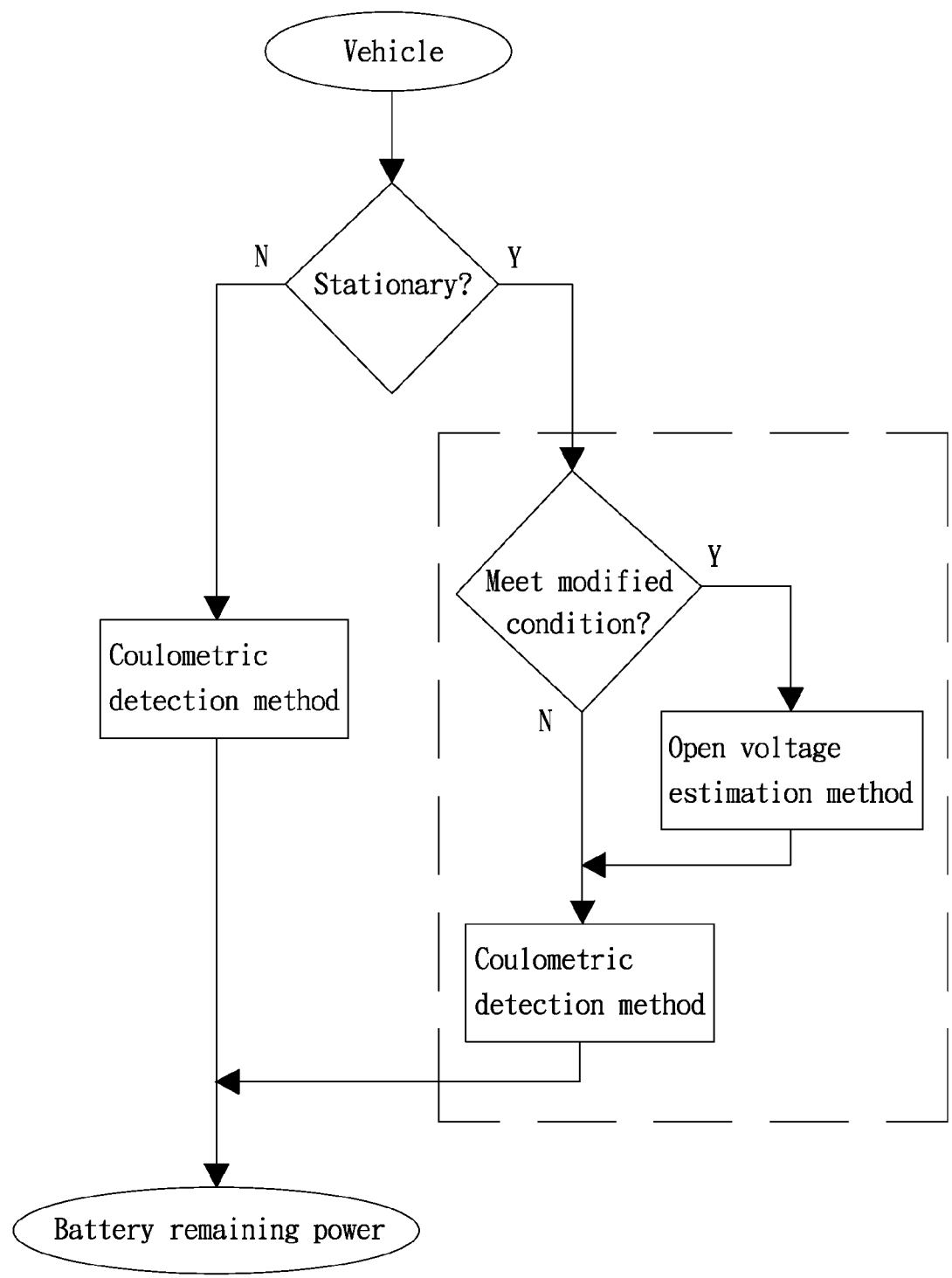
FIG. 1 illustrates a flow chart of estimating battery power in the present invention.

In order to further understand the goal, characteristics and effect of the present invention, a number of embodiments along with the drawings are illustrated as following:

Referring to FIG. 1, a method of estimating remaining battery power in electric vehicle is provided. The present invention uses coulometric detection method to obtain the remaining battery power in the electric vehicle. The unit for coulometric detection method is Ampere-hour (AH), and the percentage is obtained by dividing the total battery power, and an open voltage estimation method is used to obtain a modified battery power. When the vehicle is stationary, the modified condition for using the modified method to modify the remaining battery power is satisfied. When the battery rests for a certain period of time to reach a steady status, the difference between the remaining battery power and the modified battery power meets the modified condition. The steady status of the battery can be affected by environmental temperature, electricity amount, electrical potential difference and voltage. When the modified condition is met, the open voltage estimation method is used to modify accumulating errors generated by the coulometric detection method to increase the precision of dynamic measurement when the coulometric detection method is used.

Figure 2:
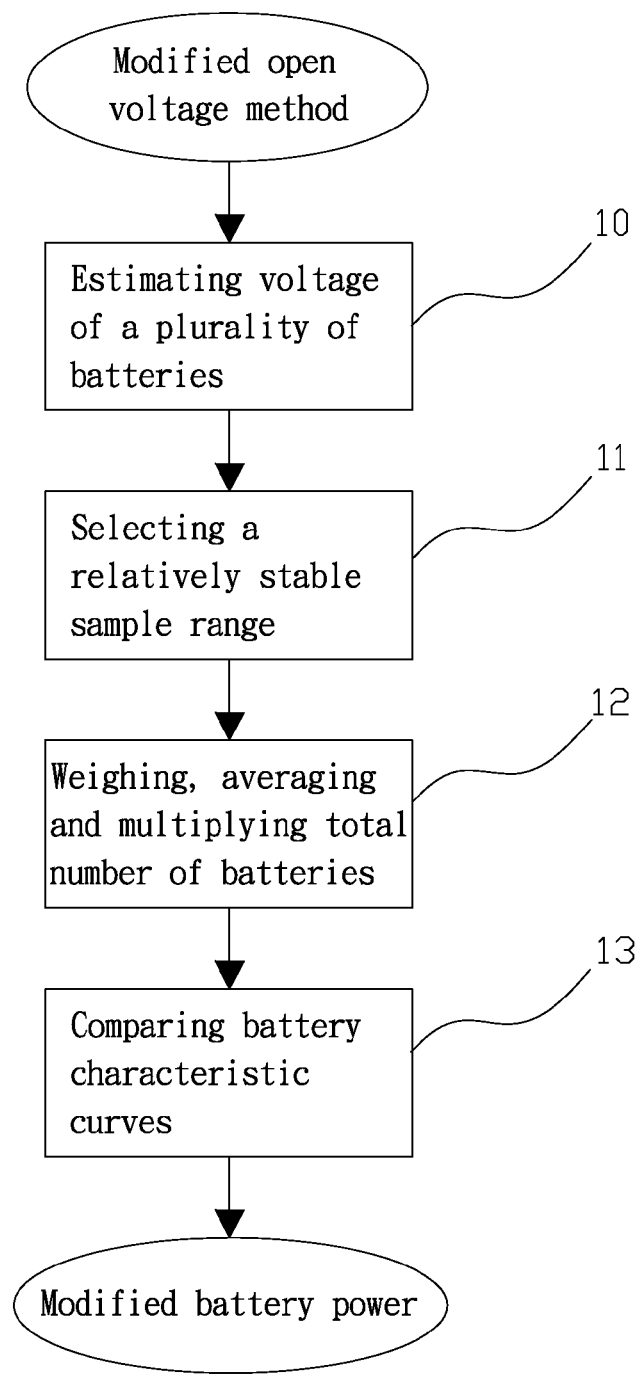
FIG. 2 illustrates a flow chart of modified open voltage method in the present invention.

Referring to FIG. 2, the open voltage estimation method is a modified open voltage method and the unit is voltage (V) corresponding to the total battery power (in percentage). The modified open voltage estimation method comprises steps of estimating a voltage value of a plurality of battery (10), selecting a relatively stable sample range among the batteries, wherein the batteries can be replaced to certain equivalent battery sets, and the sample selection range can be determined by the distribution and dispersion of overall electric power of the batteries, for example, selecting according to normal distribution (11); weighing and averaging samples selected in the sample range and multiplying the total number of batteries, and selecting representing batteries using the modified open voltage method to further reflect the voltage value, and adjusting the sample range according to the dispersion degree of the batteries (12); and comparing with battery characteristic curves to obtain modified battery power, wherein the battery characteristic curve is obtained when the battery is in a brand new condition (13).

Figure 3:
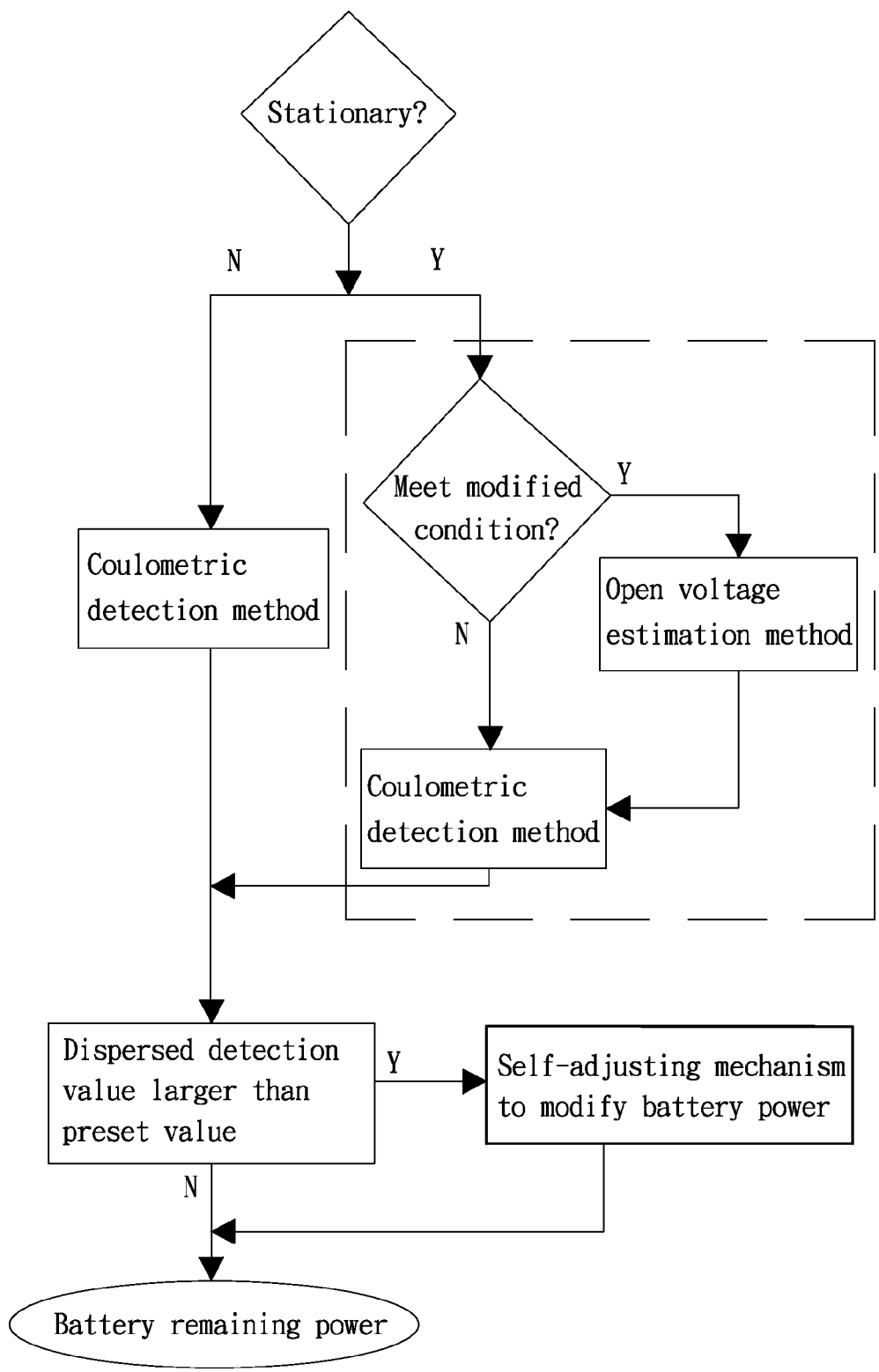
FIG. 3 illustrates a second flow chart of estimating battery power in the present invention.
Figure 4:
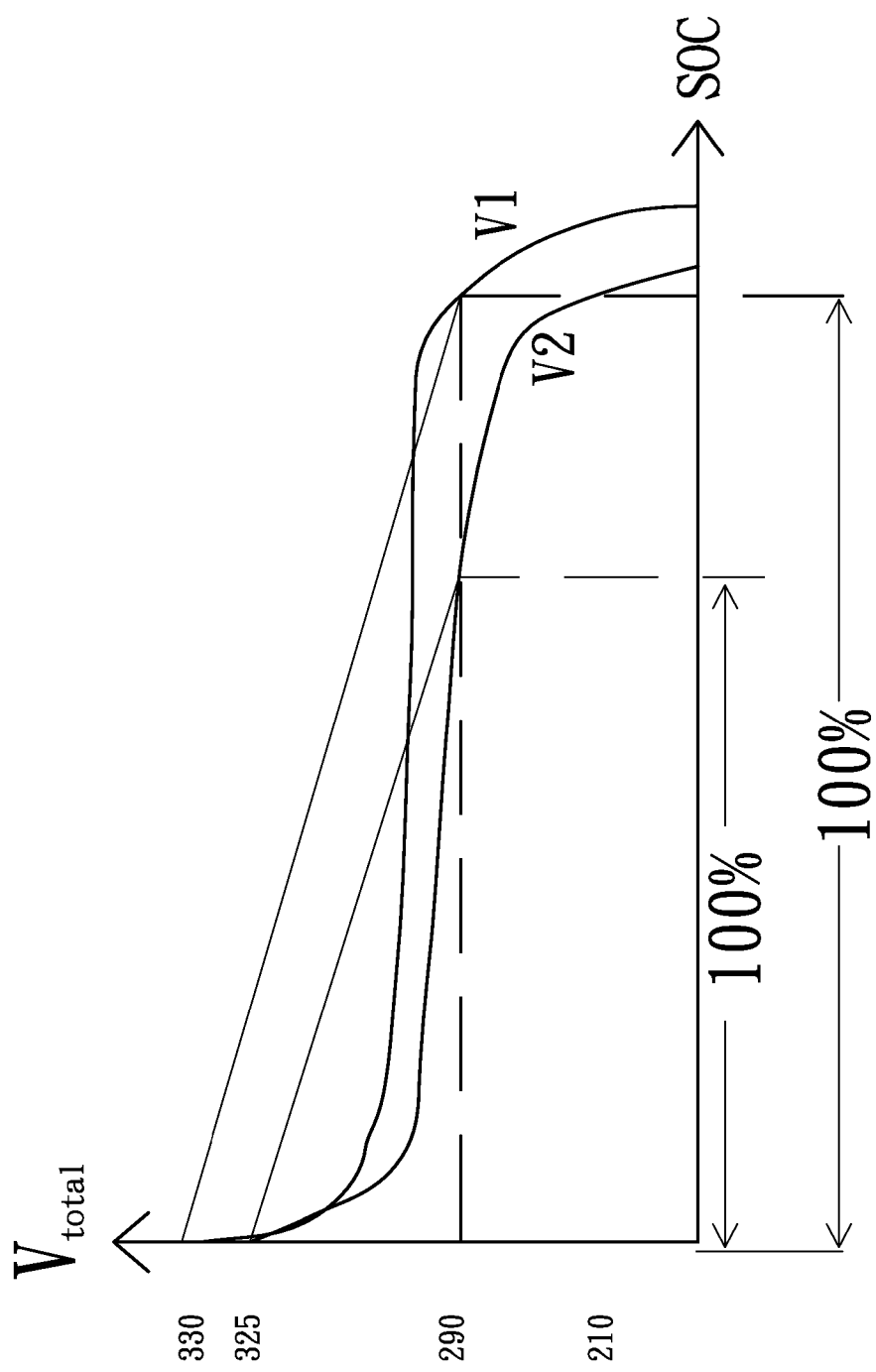
FIG. 4 illustrates a schematic view of modified battery characteristic curve in the present invention.
Figure 5:
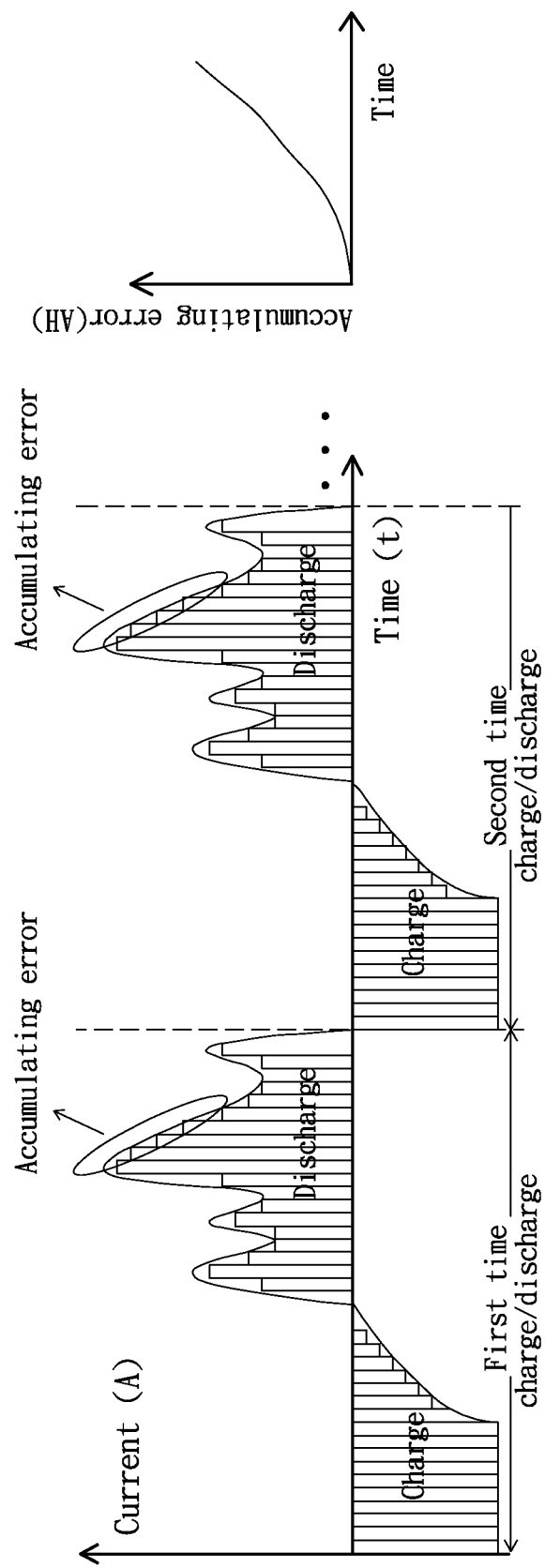
FIG. 5 illustrates a schematic view of conventional coulometric detection method with accumulating errors.

Referring to FIG. 3 for further explanation, when the batteries are charged and discharged for several times, the characteristics of the batteries are different and the total electrical power decreases, and the battery voltage becomes obviously dispersed. At this time, the battery can start a self-adjusting process to modify battery power according to the characteristic of the batteries and different usage conditions, e.g. modifying the number of times of charge/discharge. Referring to FIG. 4, a modified battery characteristic curve is V1 and total battery power between 330V and 290V is considered 100%. When the batteries are completely charged, the battery's modified characteristic curve moves to V2, so an equation can be established using a regression method on the original battery characteristic curve. When the batteries in the modified open voltage method are charged and discharged, the degree of dispersion can be detected at every stage and the self-adjusting mechanism can be activated to modify the battery power. The self-adjusting mechanism is used to adjust the selection of the sample in a relatively stable range of the batteries, so that a detection value is equal to the preset value to further achieve the goal of controlling the degree of dispersion. The degree of dispersion can be used to calculate the average power value of all batteries, and the detection value can be obtained by subtracting each battery power and then adding them altogether. When the detection value is larger than the preset value, the modified open voltage curve will be adjusted. Moreover, the detection value can also be obtained by setting a voltage range and conducting statistics regarding the batteries that are not in the voltage range. When the detection value is larger than the preset value, the modified open voltage curve will be adjusted.

According to the embodiment stated above, the present invention is advantageous because (a) the present invention uses coulometric detection method to obtain the remaining battery power in the electric vehicle, and an open voltage estimation method is used to obtain a modified battery power and satisfy modified conditions to use modified battery power to modify battery remaining power. Namely, the open voltage estimation method is used to modify the accumulating errors generated by the coulometric detection method to increase the precision of dynamic measurement using coulometric detection method; (b) the open voltage estimation method is a modified open voltage method. The modified open voltage estimation method first estimates a voltage value of a plurality of battery; selects a relatively stable sample range among the batteries, and weighs and averages the samples selected in the sample range and multiplies the total number of batteries, and selects representing batteries using the modified open voltage method to further reflect the voltage value; and (c) when the batteries in the modified open voltage method are completely charged and discharged, the degree of dispersion can be detected at every stage and the self-adjusting mechanism can be activated to modify the battery power to increase the estimation precision of the open voltage method.

Having described the invention by the description and illustrations above, it should be understood that these are exemplary of the invention and are not to be considered as limiting. Accordingly, the invention is not to be considered as limited by the foregoing description, but includes any equivalent.

What is claimed is:

1. A method of estimating battery remaining power in electric vehicles, comprising steps of:

a first battery power measuring unit obtaining battery remaining power in electric vehicles using coulometric detection method;

a second battery power measuring unit obtaining modified battery power using open voltage estimation method;

a first modifying unit using said modified battery power to modify said battery remaining power when the battery rests for a certain period of time and battery power difference exists between the battery remaining power and modified battery power; and a second modifying unit utilizing open voltage estimation method to modify coulometric detection method that has accumulating errors to increase precision of coulometric detection method in dynamic measurement, wherein the open voltage estimation method is a modified open voltage method, the method comprising steps of: estimating voltage of a plurality of batteries; selecting a relatively stable sample range among the batteries; weighing, averaging the batteries in the sample range and multiplying total number of batteries; and comparing battery characteristic curves to obtain modified battery power, wherein when the battery is charged for a longer period of time, the modified open voltage method conducts dispersion degree detection, and when a detection value is larger than a preset value, a self-adjusting mechanism is activated to modify the battery power, wherein the dispersion degree detection includes steps of calculating an average power value of all batteries, obtaining the detection value by subtracting each battery power and then adding them altogether, and adjusting the modified open voltage curve when the detection value is larger than the preset value, wherein the dispersion degree detection includes steps of setting a voltage range; gathering statistics regarding batteries not in the voltage range; determining the preset value according to the statistics; and adjusting the modified open voltage curve when the detection value is larger than the preset value.

2. The method of estimating battery remaining power in electric vehicles of claim 1, wherein the battery reaches its steady status when resting for a certain period of time, and the battery's steady status is affected by factors including environmental temperature, electrical power, electrical potential difference and voltage.

3. The method of estimating battery remaining power in electric vehicles of claim 1, wherein the battery is allowed to be replaced by equivalent battery sets.

4. The method of estimating battery remaining power in electric vehicles of claim 1, wherein the relatively stable range is determined by degree of electrical power distribution and dispersion of the battery.

5. The method of estimating battery remaining power in electric vehicles of claim 1, wherein the self-adjusting mechanism is used to determine the relatively stable sample range among the batteries, so that the detection value equals to the preset value to achieve the result of controlling the dispersion degree.

\* \* \* \* \*